United States Patent
Oury et al.

(10) Patent No.: US 8,976,016 B2
(45) Date of Patent: Mar. 10, 2015

(54) ELECTRICAL CHARGING SYSTEM ALARM FOR A VEHICLE CHARGE CORD WITH AUTOMATIC SHUTOFF

(71) Applicant: GM Global Technology Operations LLC, Detroit, MI (US)

(72) Inventors: Andrew P. Oury, Troy, MI (US); Andres V. Mituta, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 113 days.

(21) Appl. No.: 13/788,678

(22) Filed: Mar. 7, 2013

(65) Prior Publication Data
US 2014/0253312 A1 Sep. 11, 2014

(51) Int. Cl.
*G08B 21/00* (2006.01)
*H02J 7/00* (2006.01)
*G01R 31/36* (2006.01)

(52) U.S. Cl.
CPC ............... *H02J 7/0047* (2013.01); *G01R 31/36* (2013.01)

USPC ........... 340/455; 340/438; 340/426.1; 701/22

(58) Field of Classification Search
CPC ................................ B60Q 9/00; G08B 21/185
USPC .......... 340/426.1, 438, 455; 701/22; 320/165; 180/65.265
See application file for complete search history.

(56) References Cited

U.S. PATENT DOCUMENTS

2010/0271192 A1  10/2010  Mituta

*Primary Examiner* — Jeffery Hofsass
(74) *Attorney, Agent, or Firm* — Cantor Colburn LLP

(57) ABSTRACT

An alarm system for a vehicle charge cord is provided. The alarm system has an armed state and a disarmed state. The alarm system includes a battery, a charge cord sensor, a battery state estimator ("BSE") module, and an interface module. The battery has state of charge ("SOC"), and is rechargeable to a predetermined level of charge. The charge cord sensor is configured to detect if the vehicle charge cord is connected to or disconnected from a vehicle. The BSE module is configured to monitor the SOC of the rechargeable battery and determine if the battery is charged to the predetermined level of charge. The interface module is in communication with the charge cord sensor and the BSE module. The interface module is configured to switch the alarm system from the armed state to the disarmed state.

20 Claims, 2 Drawing Sheets

ELECTRICAL CHARGING SYSTEM ALARM FOR A VEHICLE CHARGE CORD WITH AUTOMATIC SHUTOFF

FIELD OF THE INVENTION

Exemplary embodiments of the invention relate to a charge cord alarm system and, more particularly, to a charge cord alarm system that may be switched from an armed state to a disarmed state once a rechargeable battery is charged to a predetermined level.

BACKGROUND

Electric vehicle supply equipment ("EVSE") allows for the charging of battery electric vehicles ("BEV") and plug-in hybrid electric vehicles ("PHEV") from an available source of electricity. Specifically, a charge cord may be provided to connect a utility power source to a vehicle battery. For example, if the utility power source is located in a public place such as, for example, a parking garage, then an individual may connect the vehicle to the utility power source by the charge cord. However, if the vehicle is charging in a public place, the charge cord may be especially susceptible to theft. Thus, some types of vehicles currently available may have an alarm system to generally prevent the charge cord from being stolen.

The alarm system deters theft of the charge cord. However, the alarm system may also discourage the efficient utilization of the charge cord as well. This is because an alarm will sound if the charge cord is removed from the vehicle, even if the vehicle battery is completely charged. Thus, the charge cord may stay plugged in to the vehicle well in excess of the time that is needed to fully charge the vehicle battery. If there is only one charge cord available, and multiple vehicles need to be charged, then one of the vehicles may be charged for an excessive amount of time, while the remaining vehicles are not charged at all. Accordingly, it is desirable to provide an electrical charging system that efficiently utilizes the charge cord among multiple vehicles.

SUMMARY OF THE INVENTION

In one exemplary embodiment of the invention, an alarm system for a vehicle charge cord is provided. The alarm system has an armed state and a disarmed state. The alarm system includes a battery, a charge cord sensor, a battery state estimator ("BSE") module, and an interface module. The battery has state of charge ("SOC"), and is rechargeable to a predetermined level of charge. The charge cord sensor is configured to detect if the vehicle charge cord is connected to or disconnected from a vehicle. The BSE module is configured to monitor the SOC of the rechargeable battery and determine if the battery is charged to the predetermined level of charge. The interface module is in communication with the charge cord sensor and the BSE module. The interface module is configured to switch the alarm system from the armed state to the disarmed state if the battery is at the predetermined level of charge and if the vehicle charge cord is connected to the vehicle.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

Figure 1:
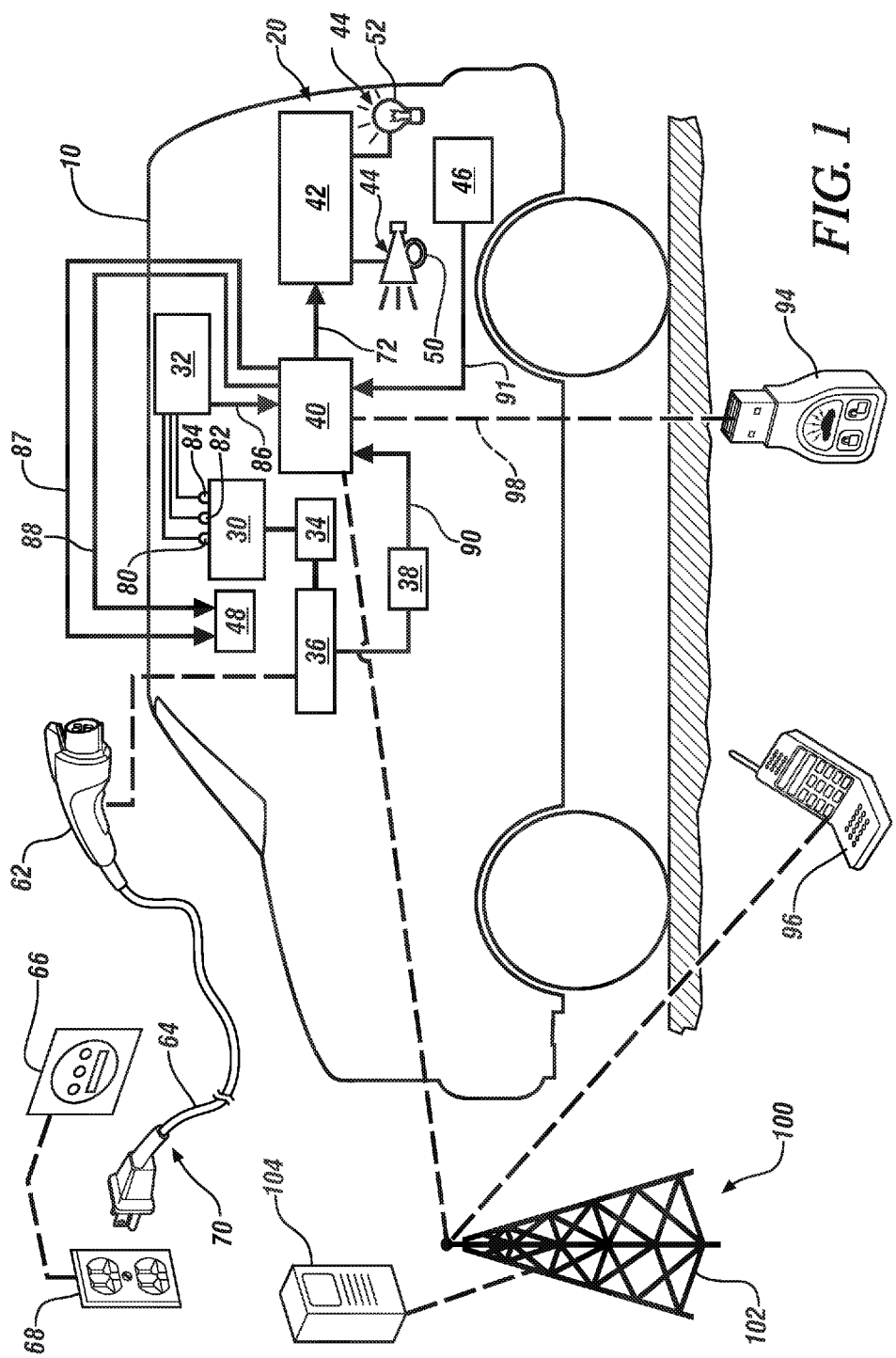
FIG. 1 is a block diagram of a charge cord alarm system in a vehicle.

The following description is merely exemplary in nature and is not intended to limit the present disclosure, its application or uses. It should be understood that throughout the drawings, corresponding reference numerals indicate like or corresponding parts and features. As used herein, the term module refers to an application specific integrated circuit (ASIC), an electronic circuit, a processor (shared, dedicated, or group) and memory that executes one or more software or firmware programs, or a combinational logic circuit.

Referring now to FIG. 1, an exemplary embodiment is directed to a vehicle 10 including a charge cord alarm system 20. The vehicle 10 may be any type of plug-in vehicle that is charged by an external source such as, for example, a battery electric vehicle ("BEV") or a plug-in hybrid electric vehicle ("PHEV"). In the exemplary embodiment as shown, the vehicle 10 includes a battery 30, a battery state estimator ("BSE") module 32, a battery charger 34, a charging port 36, a charge cord sensor 38, an interface module 40, an alarm module 42, alarm indicators 44 (e.g., a horn 50 and vehicle lighting 52), a user input 46, and a charge indicator 48. The battery 30 may be one or more rechargeable batteries such as, for example, lithium-ion batteries. The battery charger 34 provides electrical energy to charge the battery 30. The battery charger 34 is in communication with the charging port 36. The charging port 36 is configured to selectively receive a conductive coupling element 62. The conductive coupling element 62 may be a vehicle connector that is part of a vehicle charge cord 64. The vehicle charge cord 64 is configured to connect the vehicle 20 with a utility power source 66. The utility power source 66 is used to provide the electrical energy to charge the battery 30.

The vehicle charge cord 64 may be connected to a utility power socket 68 associated with the utility power source 66. The utility power socket 68 may be any type of power socket such as, for example, a 110 volt socket or a 220 volt socket. The utility power source 66 and the utility power socket 68 may be located in a variety of locations such as, for example, a public parking garage. A utility end 70 of the vehicle charge cord 64 is configured to connect with the power socket 68, or may be configured to accept an adapter (not shown) for connecting to the power socket 68. An individual may be able to connect the vehicle 10 to the utility power source 66 by the vehicle charge cord 64. Once the vehicle charge cord 64 connects the vehicle 10 to the utility power source 66, the battery 30 may be charged.

The charge cord alarm system 20 may be used to provide notification if the vehicle charge cord 64 has been disconnected from the charging port 36 of the vehicle 10 before the battery 30 has reached a predetermined level of charge during charging. In one embodiment, the predetermined level of charge of the battery 30 is about 100% state of change ("SOC"), however it is to be understood that different levels of charge may be preselected by a user as well. For example, a user may decide that he or she only needs the battery 30 charged to about 75% SOC in order to drive home from work that day. Thus, the user may preselect the predetermined level of charge to be about 75% SOC. The SOC of the battery 30 quantifies the discharge capacity of the battery 30. The SOC may be measured in percentage points, where 100% SOC indicates the battery is fully charged, and 0% indicates the battery 30 has no charge.

The charge cord alarm system 20 may include an armed state and a disarmed state. If the charge cord alarm system 20 is in the armed state, and if the vehicle charge cord 64 is disconnected from the charging port 36 of the vehicle 10 before the battery 30 has reached the predetermined level of charge, then the interface module 40 may send an alarm signal 72 to the alarm module 42. The alarm module 42 may then activate one or more of the alarm indicators 44 to indicate the vehicle charge cord 64 has been disconnected from the vehicle 10. In addition to or instead of the alarm indicators 44, in one embodiment the charge cord alarm system 20 may indicate the vehicle charge cord 64 has been disconnected from the vehicle 10 by sending a notification to a user by one or more mobile devices (e.g., a remote device 94 and a mobile electronic device 96), which is described in detail below. For example, in one embodiment, the notification may be a text message sent to the mobile electronic device 96 reading "your charge cord has been disconnected". If the charge cord alarm system 20 is in the disarmed state, the vehicle charge cord 64 may be disconnected from the vehicle 10 without activating the alarm indicators 44, or sending the notification to a user.

In the exemplary embodiment as shown in FIG. 1, the alarm indicators 44 are the horn 50 and vehicle lighting 52 (e.g., the headlamps or taillights of the vehicle 10). If the vehicle charge cord 64 is disconnected from the vehicle 10 before the battery 30 has reached the predetermined level of charge while the charge cord alarm system 20 is in the armed state, the horn 50 may create an alarm tone, and the vehicle lights may flash at a specific frequency or brightness to indicate the alarm has been activated. Although vehicle lighting 52 and a horn 50 are discussed, the alarm indicators 44 may be any type of device for providing an audible or visual indicator that removal of the vehicle charge cord 64 has occurred such as, for example, a siren.

In one embodiment, the charging port 36 may include a locking mechanism (not shown) to secure the conductive coupling element 62 if the charge cord alarm system 20 is in the armed state. The locking mechanism may be any type of device or feature (e.g., a latch) that generally prevents the conductive coupling element 62 from being removed from the charging port 36 while the charge cord system 20 is in the armed state. If the charge cord alarm system 20 is in the disarmed state, the locking mechanism may disengage from the conductive coupling element 62, and the conductive coupling element 62 may be removed from the charging port 36.

A status of the charge cord alarm system 20 (e.g., the armed state and the disarmed state) may be indicated by the charge indicator 48. The charge indicator 48 may be any type of visual device for indicating the status of the charge cord alarm system 20. For example, in one embodiment the charge indicator 48 may be a light with multiple color options located on a dashboard (not shown) of the vehicle 10. The charge indicator 48 may be visible outside of the vehicle 10. In one embodiment, the light may be illuminated red if the charge cord alarm system 20 is in the armed state, and illuminated green if the charge cord alarm system 20 is in the disarmed state. In another embodiment, the charge indicator 48 may be a set of multiple lights that are illuminated based on the status of the charge cord alarm system 20 (e.g., a red light is illuminated if the charge cord alarm system 20 is in the armed state, and a green light is illuminated if the charge cord alarm system 20 is in the disarmed state). In yet another embodiment, the charge indicator 48 is a liquid crystal display ("LCD") screen located on the dashboard (not shown) of the vehicle 10 that displays the words "armed" or "disarmed" based on the status of the charge cord alarm system 20.

In one embodiment, the charge indicator 48 may be omitted, and instead the horn 50 and the vehicle lighting 52 may be used to indicate the status of the charge cord alarm system 20. For example, if the vehicle charge cord 64 is disconnected from the vehicle 10, and if the charge cord alarm system 20 is in the armed state, the horn 50 and vehicle lighting 52 may create a pre-alarm warning. Specifically, in one embodiment, the pre-alarm warning may include a few relatively short horn chips or tones created by the horn 50, and the vehicle lighting 52 may also be illuminated on and off to create intermittent light flashes. The horn chips may be lower in amplitude and volume when compared to the actual alarm tones made by the horn 50, and the light flashes may be less bright, of a lower frequency, or of a shorter duration when compared to the light flashes created if the alarm is activated. However, if the vehicle charge cord 64 is not connected back to the charging port 36 of the vehicle 10 within a predetermined amount of time after the pre-alarm warning has been issued, then the horn 50 may create the alarm tone, and the vehicle lighting 52 may flash at a specific frequency or brightness to indicate the alarm has been activated.

The BSE module 32 monitors the temperature, current, and voltage of the battery 30 using various sensors as the battery 30 is being charged or discharged to determine the SOC of the battery 30. For example, the BSE module 32 may monitor a current sensor 80 that monitors the current flowing from the battery 30, a voltage sensor 82 for measuring the voltage drop across the battery 30, and a temperature sensor 84 for monitoring the battery temperature. The temperature sensor 84 may be, for example, a thermocouple that is attached to the battery 30. The BSE module 32 determines the SOC of the battery 30 based on the temperature, current, and voltage of the battery 30.

The BSE module 32 monitors the SOC as the battery 30 is charged. Once the battery 30 reaches the predetermined level of charge, the BSE module 32 may send a charge complete signal 86 to the interface module 40. In one embodiment, the predetermined level of charge may be the fully charged level (e.g., 100% SOC), however, it is to be understood that a user may also select a different level of charge as well (e.g., 75% SOC). In one embodiment, the charge complete signal 86 may be used to disarm the charge cord alarm system 20.

The charge cord sensor 38 monitors the charging port 36 to determine if the vehicle charge cord 64 is connected to the charging port 36 of the vehicle 10. The charge cord sensor 38 may be any type of device to measure the electrical characteristics of power flowing through the vehicle charge cord sensor 38 to the charging port 36. For example, the charge cord sensor 38 may be may include circuits for measuring the voltage level of AC power at the charging port 36 such as a voltage meter or a voltage comparator circuit, or include circuits for measuring current flowing through the vehicle charge cord 64 to the vehicle 10, such as a current meter. In another exemplary embodiment, the charge cord sensor 38 is a proximity sensor that detects, through a voltage divider, the presence of the vehicle charge cord 64, even if the vehicle charge cord 64 is not connected to the power socket 68.

The charge cord sensor 38 generates a charge cord signal 90 that indicates the presence or absence of the vehicle charge cord 64 in the charging port 34. The charge cord signal 90 is sent to the interface module 40. If the vehicle charge cord 64 is coupled to the charging port 36, the charge cord signal 90 indicates a connected status to the interface module 40. If the vehicle charge cord 64 is not coupled to the charging port 34, the charge cord signal 90 indicates a disconnected status.

The interface module 40 is in communication with the BSE module 32, charge cord sensor 38, the alarm module 42, the charge indicator 48, and the user input 46 of the vehicle 10. The interface module 40 receives the charge cord signal 90 from the charge cord sensor 38 and the charge complete signal 86 from the BSE module 32. The interface module 40 may arm or disarm the charge cord alarm system 20 based on the charge complete signal 86 and the charge cord signal 90. In one embodiment, the interface module 40 may arm the charge cord alarm system 20 if the charge cord signal 90 indicates a connected status. Arming the charge cord alarm system 20 may include sending an electric vehicle supply equipment ("EVSE") unavailable signal 87 to the indicator 48. The EVSE unavailable signal 87 may change the status of the charge indicator 48 to indicate the armed state.

The charge cord alarm system 50 may remain in the armed state until the charge complete signal 86 is sent from the BSE module 32 to the interface module 40. Upon receipt of the charge complete signal 86, the charge cord alarm system 20 may be disarmed. Disarming the charge cord alarm system 20 may include generating an EVSE available signal 88 by the interface module 40. The EVSE available signal 88 may change the status of the charge indicator 48 from the armed state to the disarmed state (e.g., the charge indicator 48 may change from red to green).

It should be noted that while the charge cord signal 90 sent from the charge cord sensor 38 and the charge complete signal 86 sent from the BSE module 32 are discussed, the charge cord alarm system 20 may be armed or disarmed based on additional signals related to the vehicle 10 as well. For example, in one embodiment, the charge cord alarm system 20 may be armed if the charge cord signal 90 indicates the connected status, and if doors (not shown) of the vehicle 10 have been locked. In another embodiment, the charge cord alarm system 20 may be armed if the charge cord signal 90 indicates the connected status, and if a user arms the charge cord alarm system 20 manually (e.g., by the remote device 94, the mobile electronic device 96, or the user input 46, which is described below). Likewise, a user may also manually disarm the charge cord alarm system 20 using the remote device 94, the mobile electronic device 96, or the user input 46 as well, and is described below.

The user input 46 may be any device for receiving input from a user, and may be located on the dashboard (not shown) within the vehicle 10. The user input 46 may be, for example, a keypad or a keyboard for allowing a user to input information. In another embodiment, the user input 46 may a touchscreen that detects the presence and location of a user's touch. In yet another embodiment, the user input 46 may be a microphone for recording or detecting a user's voice. A user may be able to manually arm the charge cord alarm system 20 using the user input 46. For example, the charge cord alarm system 20 may only be armed if the user input 46 indicates input has been entered indicating the armed state is desired, in addition to the charge cord signal 90 indicating the connected status.

In one embodiment, a user may be able to select whether the charge cord alarm system 20 will be disarmed once the battery 30 has been charged to the predetermined level. Specifically, the user input 46 may send a disable signal 91 to the interface module 40, which prevents the interface module 40 from disarming the charge cord alarm system 20 once the battery 30 is charged to the predetermined level. Specifically, the disable signal 91 prevents the interface module 40 from sending the alarm signal 72 to activate one or more of the alarm indicators 44. The disable signal 91 also prevents the interface module 40 from sending notification to the remote device 94, the mobile electronic device 96 (which is described below). The disable signal 91 may also be used to prevent the interface module 40 from sending the EVSE available signal 88 to the charge indicator 48. Thus, the charge indicator 48 will continue to indicate the armed state. Thus, a user may be able to keep the charge cord alarm system 20 armed even after the battery 30 has been charged to the predetermined level.

The interface module 40 may also be in wireless communication with the remote device 94 and the mobile electronic device 96. Specifically, the interface module 40 may include a receiver or transceiver (not shown) that is configured to receive and send information and instructions from the remote device 94 and the mobile electronic device 96. The remote device 94 may be any type of portable device that allows for a user to remotely arm and disarm the charge cord alarm system 20 such as, for example, a key fob. In one embodiment, the remote device 94 may also include an information conveying device (not shown) such as, for example, a display, a light bulb, a speaker, or a vibration mechanism. The remote device 94 may also be part of a smart keyless system, which allows a user to perform other functions associated with the vehicle 10 such as locking and unlocking doors and opening a trunk (not shown).

In one embodiment, if the vehicle charge cord 64 is disconnected from the vehicle 10 while the charge cord alarm system 20 is armed (e.g., the charge cord signal 90 indicates a disconnected status but the BSE module 32 has not sent the charge complete signal 86 to the interface module 40), the interface module 40 and the alarm module 42 may alert the user by sending a wireless signal 98 to the remote device 94. The information conveying device (not shown) located within the remote device 94 is activated by the wireless signal 98, and notifies a user of the removal of the vehicle charge cord 94 (e.g., by tactile feedback, sounding an alarm, or flashing a light). In one embodiment, if the alarm indicators 44 (e.g., the horn 50 and the vehicle lights) have been activated to sound an alarm, a user may silence the alarm indicators 44 using the remote device 94. For example, a user may press one or more buttons (not shown) on the remote device 94.

The mobile electronic device 96 is in communication with the interface module 40 through a wireless communication network 100. The mobile electronic device 96 may be any device that communicates with the wireless communication network 100 such as, for example, a smartphone. The interface module 40 is also in communication with the wireless network 100 as well. In one embodiment, the network 100 is a cellular network that includes several cellular sites 102 where antennas and electronic communications equipment are placed. The network 100 may also include a remote communications server 104 that is in communication with the cellular sites 102. The remote communications server 104 is configured to receive data from the interface module 40 and the mobile electronic device 96 though the network 100, interpret the data from the interface module 40 and the mobile electronic device 96, and determine instructions based on the data from the interface module 40 and the mobile electronic device 96. The remote communications server 104 may be a telecommunications server (e.g., maintained by a telecommunications carrier such as, for example Verizon®) or telematics server (e.g., maintained by a telematics provider such as, for example, OnStar j).

In one embodiment, if the vehicle charge cord 64 is disconnected from the charging port 36 while the charge cord alarm system 20 is armed, the interface module 40 may send notification to the mobile electronic device 96 through the wireless network 100. The notification may be, for example, a text message, or a pre-recorded telephone call. A user may have the option of either ignoring the notification, or visiting the vehicle 10 to regain possession of his or her vehicle charge cord 64. In one embodiment, if the alarm indicators 44 (e.g., the horn 50 and the vehicle lights) have been activated to sound an alarm, a user may silence the alarm indicators 44 using the mobile electronic device 96 (e.g., by a mobile application that has been downloaded from the network 100). In one embodiment, the mobile electronic device 96 may also be used to arm or disarm the charge cord alarm system 20 as well (e.g., using the mobile application).

The charge cord alarm system 20 as described above may be disarmed once the battery 30 is charged to the predetermined level (unless a user decides to keep the charge cord alarm system 20 armed even after the battery 30 has been charged to the predetermined level). Some types of charge cord alarm systems that are currently available discourage the efficient utilization of the charge cord, as an alarm will sound if the charge cord is removed from the vehicle, even if the vehicle battery is completely charged. Thus, the charge cord stays plugged in to the vehicle well in excess of the time that is needed to fully charge the vehicle battery. In contrast, the indicator 48 as described above communicates the status of the charge cord alarm system 20 (e.g., the armed and disarmed state). Once the battery 30 has been charged to the predetermined level and the charge cord alarm system 20 has been disarmed, another user may be able to disconnect the vehicle charge cord 64 from the vehicle 10 without triggering the alarms or sending a notification to the remote device 94 and the mobile electronic device 96. Thus, the charge cord alarm system 20 allows for improved utilization of the utility power source 66 between multiple users.

Figure 2:
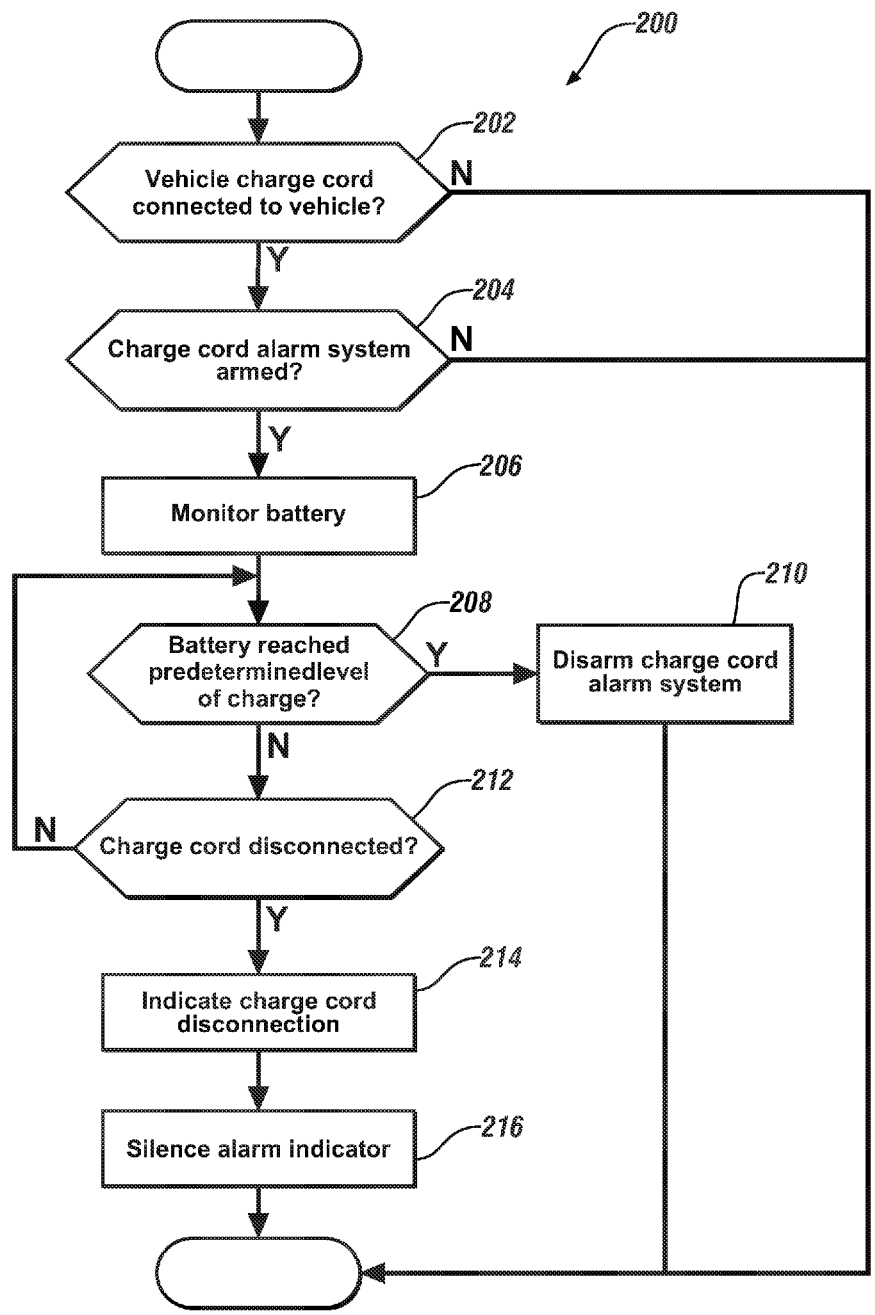
FIG. 2 is a process flow diagram illustrating one approach for activating and deactivating the charge cord alarm system.

FIG. 2 is a process flow diagram illustrating a method 200 for operating the charge cord alarm system 20. Referring now to both FIGS. 1-2, method 200 begins at step 202, where the charge cord alarm system 20 determines if the vehicle charge cord 64 is connected to the vehicle 10. The charge cord sensor 38 monitors the charging port 36 and generates the charge cord signal 90 based on the presence or absence of the vehicle charge cord 64 in the charging port 34. If the vehicle charge cord 64 is not coupled to the charging port 36, the charge cord signal 90 indicates the disconnected status to the interface module 40, and method 200 may terminate. However, if the vehicle charge cord 64 is connected to the vehicle 10, then the charge cord signal 90 indicates the connected status to the interface module 40, and method 200 may proceed to step 204.

In step 204, the charge cord alarm system 20 may be armed. In one embodiment, the charge cord alarm system 20 is armed as long as the vehicle charge cord 64 is connected to the vehicle 10 (e.g., the charge cord signal 90 indicates the connected status). In another embodiment, the charge cord alarm system 20 may only be armed if the vehicle charge cord 64 is connected to the vehicle 10, and if additional actions related to the vehicle 10 have been performed as well (e.g., if doors of the vehicle 10 have been locked, or if a user arms the charge cord alarm system 20 manually by the remote device 94, the mobile electronic device 96, or the user input 46). If the charge cord alarm system 20 is not armed, then method 200 may then terminate. If the charge cord alarm system 20 is armed, then method 200 may proceed to step 206.

In step 206, the BSE module 32 monitors the temperature, current, and voltage of the battery 30, and determines the SOC of the battery 30 based on the temperature, current, and voltage of the battery 30. Method 200 may then proceed to step 208.

In step 208, if the battery 30 reaches the predetermined level of charge, then the BSE module 32 sends the charge complete signal 86 to the interface module 40. Method 200 may then proceed to step 210. It should be noted that in some embodiments, a user may decide not to disarm the charge cord alarm system 20 even if the charge complete signal 86 is sent to the interface module 40. If this occurs, method 200 may proceed to step 212.

In step 210, the charge cord alarm system 20 is disarmed. If the charge cord alarm system 20 is disarmed, the interface module may send the EVSE available signal 88 to the indicator 48 to change the status of the charge indicator 48 from the armed state to the disarmed state. Method 200 may then terminate.

If the battery has not reached the predetermined level of charge in step 208, then method 200 may proceed to step 212. In step 212, the charge cord sensor 38 continues to monitor the charging port 36 to determine if the vehicle charge cord 64 has been disconnected from the vehicle 10 (e.g., the charge cord signal 90 indicates the disconnected status). Once the charge cord signal 90 indicates the disconnected status, method 200 may then proceed to step 214.

In step 214, the charge cord alarm system 20 provides notification that the vehicle charge cord 64 has been disconnected from the vehicle 10. In one embodiment, the interface module 40 sends the alarm signal 72 to the alarm module 42. The alarm module 70 may then activate one or more of the alarm indicators 44 to indicate removal of the vehicle charge cord 64. In addition to or instead of the alarm indicators 44, the charge cord alarm system 20 may indicate that removal of the vehicle charge cord 64 has occurred by sending notification to the remote device 94 or the mobile electronic device 96. Method 200 may then proceed to step 216.

In step 216, a user may silence the alarm indicators 44 using the remote device 94 or the mobile electronic device 96. For example, a user may press one or more buttons on the remote device 94 to silence the alarm indicators 44. In another embodiment, a user may silence the alarm indicators 44 using the mobile electronic device 96 (e.g., by a mobile application downloaded from the network 100). It should be noted that step 216 is optional, and may be omitted in some embodiments. Method 200 may then terminate.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that invention not be limited to the particular embodiments disclosed, but that the invention will include all embodiments falling within the scope of the application.

What is claimed is:

1. An alarm system for a vehicle charge cord, the alarm system having an armed state and a disarmed state, comprising:
   a battery having state of charge ("SOC"), wherein the battery is rechargeable to a predetermined level of charge;
   a charge cord sensor configured to detect if the vehicle charge cord is connected to or disconnected from a vehicle;

a battery state estimator ("BSE") module configured to monitor the SOC of the rechargeable battery and determine if the battery is charged to the predetermined level of charge; and an interface module in communication with the charge cord sensor and the BSE module, the interface module configured to switch the alarm system from the armed state to the disarmed state if the battery is at the predetermined level of charge and if the vehicle charge cord is connected to the vehicle.

2. The alarm system of claim 1, further comprising a charge indicator in communication with the BSE module, the charge indicator providing indication if the alarm system is in the armed state or the disarmed state.

3. The alarm system of claim 1, further comprising a user input, wherein the user input is configured to selectively send a disable signal to the interface module that prevents the interface module from switching the alarm system from the armed state to the disarmed state.

4. The alarm system of claim 1, further comprising a charging port configured to selectively receive the vehicle charge cord, wherein the charge cord sensor monitors the charging port to determine if the vehicle charge cord is connected to or disconnected from the vehicle.

5. The alarm system of claim 1, wherein the interface module is wirelessly connected to a remote device, wherein the remote device is configured to remotely switch the alarm system between the armed state and the disarmed state.

6. The alarm system of claim 5, wherein the remote device includes an information conveying device that provides notification that the vehicle charge cord is disconnected from the vehicle if the alarm system is in the armed state.

7. The alarm system of claim 1, wherein the interface module is wirelessly connected to a mobile electronic device, and wherein the interface module sends notification to the mobile electronic device through a wireless network if the vehicle charge cord is disconnected from the vehicle if the alarm system is in the armed state.

8. The alarm system of claim 7, wherein the mobile electronic device is a smartphone.

9. The alarm system of claim 7, wherein the notification is at least one of a text message and a pre-recorded telephone call.

10. The alarm system of claim 1, further comprising at least one alarm indicator configured to indicate if the vehicle charge cord is disconnected from the vehicle if the alarm system is in the armed state.

11. A method of monitoring a vehicle charge cord by an alarm system having an armed state and a disarmed state, comprising:

detecting if the vehicle charge cord is connected to or disconnected from a vehicle by a charge cord sensor;

monitoring a state of charge ("SOC") of a battery by a battery state estimator ("BSE") to determine if the battery is charged to a predetermined level of charge;

monitoring the charge cord sensor and the BSE module by an interface module; and switching the charge cord alarm system from the armed state to the disarmed state by the interface module if the battery is at the predetermined level of charge and if the vehicle charge cord is connected to the vehicle.

12. The method of claim 11, further comprising providing a charge indicator in communication with the BSE module, the charge indicator providing indication if the charge cord alarm system is in the armed state or the disarmed state.

13. The method of claim 11, further comprising providing a user input, wherein the user input is configured to selectively send a disable signal to the interface module that prevents the interface module from switching the alarm system from the armed state to the disarmed state.

14. The method of claim 11, further comprising providing a charging port configured to selectively receive the vehicle charge cord, wherein the charge cord sensor monitors the charging port to determine if the vehicle charge cord is connected to or disconnected from the vehicle.

15. The method of claim 11, wherein the interface module is wirelessly connected to a remote device, wherein the remote device is configured to remotely switch the alarm system between the armed state and the disarmed state if the alarm system is in the armed state.

16. The method of claim 15, wherein the remote device includes an information conveying device that provides notification that the vehicle charge cord is disconnected from the vehicle.

17. The method of claim 11, wherein the interface module is wirelessly connected to a mobile electronic device, and wherein the interface module sends notification to the mobile electronic device through a wireless network if the vehicle charge cord is disconnected from the vehicle if the alarm system is in the armed state.

18. The method of claim 17, wherein the mobile electronic device is a smartphone.

19. The method of claim 17, wherein the notification is at least one of a text message and a pre-recorded telephone call.

20. The method of claim 11, further comprising at least one alarm indicator configured to indicate if the vehicle charge cord is disconnected from the vehicle if the alarm system is in the armed state.

* * * * *